(12) United States Patent
Ishii

(10) Patent No.: US 8,379,175 B2
(45) Date of Patent: Feb. 19, 2013

(54) INTERCONNECTION STRUCTURE BETWEEN SIGNAL LINE AND THIN FILM TRANSISTOR

(75) Inventor: Hiromitsu Ishii, Tokyo (JP)

(73) Assignee: Casio Computer Co., Ltd., Tokyo (JP)

( * ) Notice: Subject to any disclaimer, the term of this patent is extended or adjusted under 35 U.S.C. 154(b) by 804 days.

(21) Appl. No.: 12/500,376

(22) Filed: Jul. 9, 2009

(65) Prior Publication Data

US 2010/0012939 A1 Jan. 21, 2010

(30) Foreign Application Priority Data

Jul. 19, 2008 (JP) ................................ 2008-187981

(51) Int. Cl.
*G02F 1/1343* (2006.01)
(52) U.S. Cl. ............................. 349/139; 349/43; 349/38
(58) Field of Classification Search ................... 349/43, 349/38, 139, 138, 143; 257/59, E33.004
See application file for complete search history.

(56) References Cited

U.S. PATENT DOCUMENTS 5,771,083 A * 6/1998 Fujihara et al. ............... 349/147

FOREIGN PATENT DOCUMENTS

| JP | 2002-98993 A | 4/2002 |
| JP | 2004-341185 A | 12/2004 |

* cited by examiner

*Primary Examiner* — Thoi Duong
(74) *Attorney, Agent, or Firm* — Chen Yoshimura LLP

(57) ABSTRACT

A liquid crystal display device achieving high aperture rate and high definition is disclosed. The liquid crystal display device comprises a plurality of scanning lines 12, an insulating film 21 covering the plurality of scanning lines, a plurality of signal lines 13 having an intersection 13D with each of the scanning lines 12, pixel electrodes formed adjacent to the scanning line and the signal line, a plurality of thin film transistors, each of which having a gate electrode, drain electrode 14b, and source electrode 14a, a gate electrode connected to a semiconductor layer, a gate insulating film, and the scanning lines, a drain electrode 14b or a source electrode 14a connected to the signal lines, the other of the drain and the source electrodes connected to the pixel electrode, the drain electrode and the source electrode are linearly disposed along the signal lines, and a plurality of relay electrodes 17 in which a first overlapped portion 17a overlaps the intersection 13D and a second overlapped portion 17c overlaps one of the electrodes, thus connecting that electrode to the signal lines. The first overlapped portion of the relay electrode has a length sufficient to cover the stepped portions 13E, 13D of the insulating film 21 corresponding to the both ends 12b, 12c of the scanning line 12 in a width direction.

20 Claims, 8 Drawing Sheets

FIG.2A
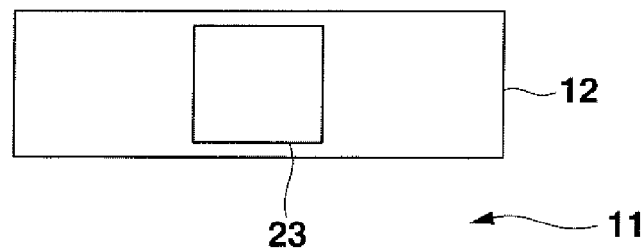
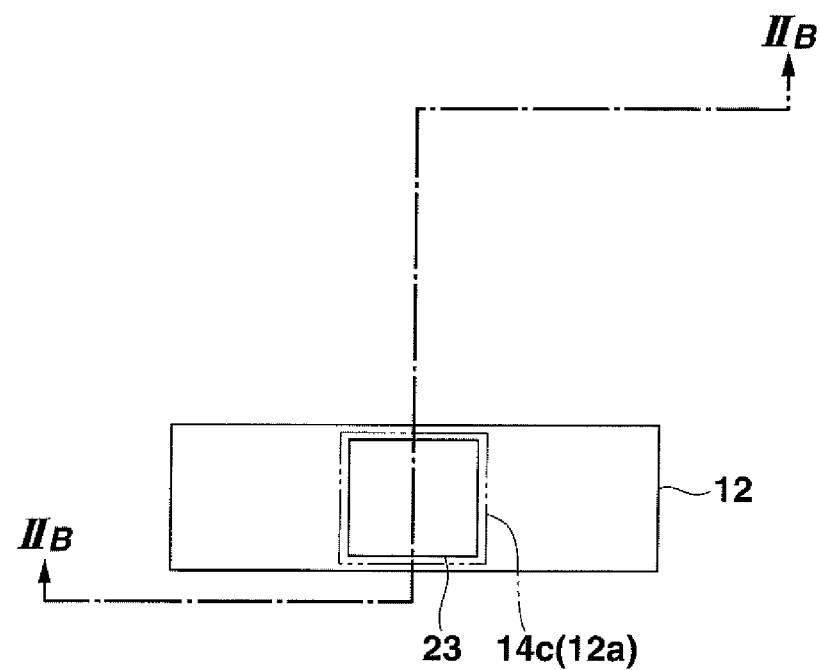
FIG.2B
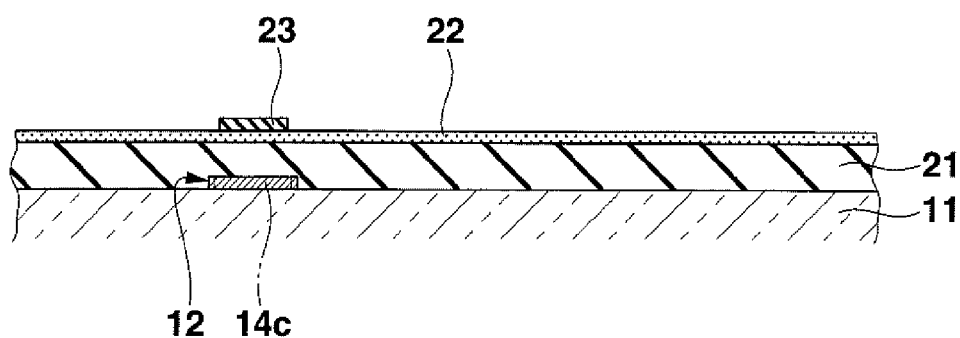

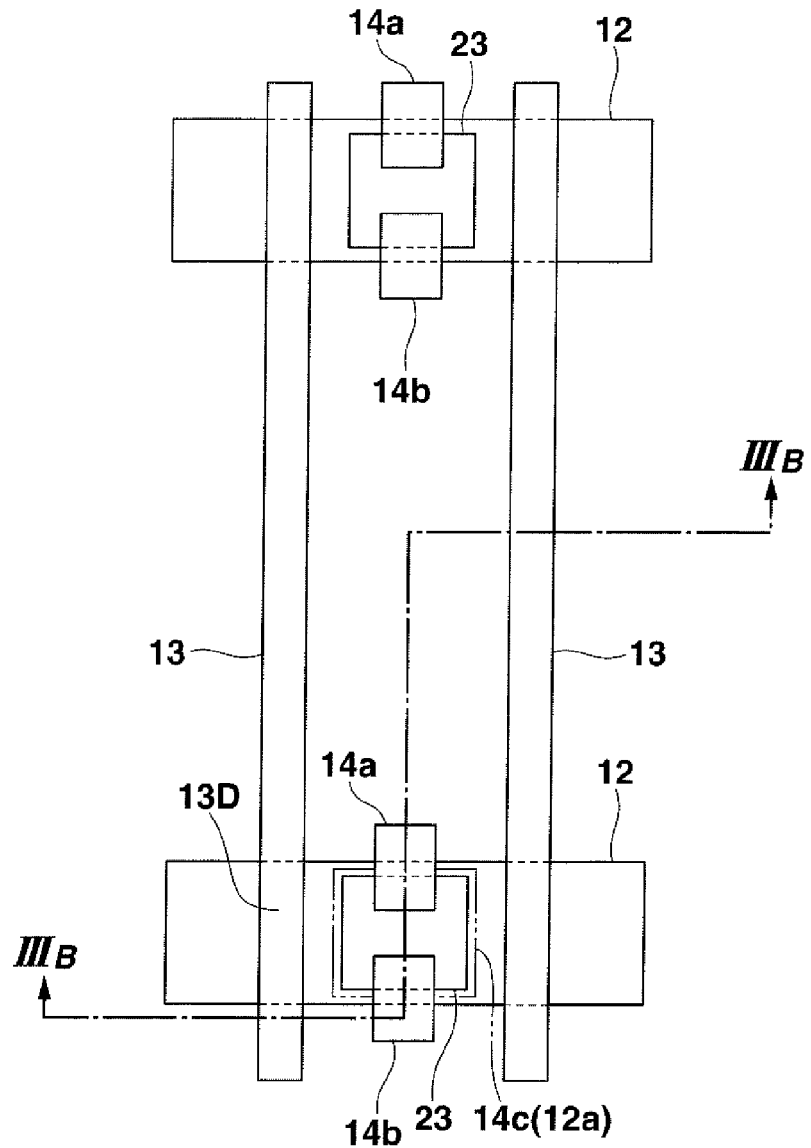
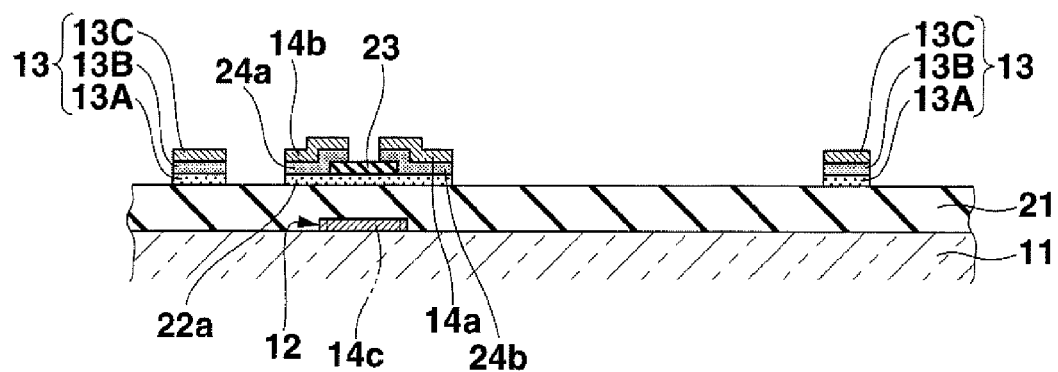

INTERCONNECTION STRUCTURE BETWEEN SIGNAL LINE AND THIN FILM TRANSISTOR

This application claims the benefit of Japanese Applications No. 2008-187981 filed in Japan on 19 Jul. 2008, which is herein incorporated by reference in its entirety.

BACKGROUND OF THE INVENTION

1. Field of the Invention

The present invention relates to an interconnection structure between a signal line and a thin film transistor capable of achieving high aperture rate and high definition, and applicable to TFT array substrates for display devices such as liquid crystal displays and organic electroluminescence (EL) display devices.

2. Description of the Related Art

As disclosed in JP2004-341185A for example, a conventional liquid crystal display device comprises scanning lines, signal lines, pixel electrodes, thin film transistors that include a gate electrode connected to a corresponding scanning line in proximity to each point of intersection of a scanning line and a signal line, a drain electrode connected to a corresponding signal line, and a source electrode connected to a pixel electrode, storage capacitor lines a part of which is overlapped with a pixel electrode to form a storage capacitor, a counter electrode, and liquid crystal placed between each pixel electrode and counter electrode.

In each thin film transistor, pairs of a source electrode, which is connected to a pixel electrode, and a drain electrode, which is connected to a signal line, are arranged in the scanning line array direction. The source electrode is integrated with a pedestal, which extends along the scanning line, thus forming a single layer, and the pedestal and the pixel electrode are connected via a contact hole created on an insulating layer on the pedestal, and as a result, the pixel electrode is connected to the source electrode.

In such a liquid crystal display device, a plurality of storage capacitor lines are formed on a plurality of scanning lines and signal lines via a first insulating film, with storage capacity units of each storage capacity line covering corresponding pairs of a scanning line and a signal line. On those storage capacity units, a plurality of pixel electrodes is formed via a second insulating film. The above structure allows a plurality of scanning lines, signal lines, and thin film transistors to be installed overlapped with a plurality of pixel electrodes, narrowing the space between each pixel electrode up to the processing limit and thus achieving high aperture rate.

In the liquid crystal display device disclosed in JP2002-98993A, three pixel electrodes (R, G, B) constituting a pixel are placed in positions of vertices of an isosceles triangle. These pixel electrodes are installed displaced from each other, with a source electrode, gate electrode, and drain electrode of each thin film transistor installed column-wise, and the drain electrode protruding from the signal line in the row direction. This structure allows an L-shaped groove, for example, to be formed in the vicinity of each source electrode when the pixel electrode and the signal line are connected. When the drain electrode, signal line, and source electrode are formed, the existence of a photoresist film deepens these L-shaped grooves to some extent. When a metal film is etched with the photoresist used as a mask, etchant tends to stay in the L-shaped grooves, which may cause improper processing, and in the worst case, the signal line including the drain electrode and the source electrode may be short-circuited.

As disclosed in JP2002-98993A, to prevent L-shaped grooves from being formed, the side edge of signal lines of a liquid crystal display device is used as a drain electrode, and a source electrode is formed linearly in the direction of the scanning lines to the drain electrode. This prevents retention of etchant used for metal film etching with a photoresist film used as a mask when a drain electrode, signal lines connected to the drain electrode, and a source electrode are formed. Improper processing and short circuit between the drain electrode and the source electrode can thus be prevented.

Meanwhile, in a liquid crystal display device disclosed in JP2004-341185A, to achieve higher definition, the pitch of scanning lines and that of signal lines are further reduced. If the pitch of adjacent signal lines is reduced to below 20 μm for example, it becomes infeasible to linearly install the source electrode and drain electrode of a thin film transistor between adjacent signal lines in the direction of scanning lines.

The structure of a liquid crystal display device 1 shown in FIG. 7 solves this problem. The liquid crystal display device 1 comprises scanning lines 2 arranged in rows, signal lines 3 arranged in columns, thin film transistors 4 installed in each region defined by scanning lines 2 and signal lines 3, a pixel electrode 5 connected to the source electrode 4a of each thin film transistor 4 via a contact hole, and a storage capacitor electrode 6 installed between the pixel electrode 5 and a scanning line 2/signal line 3 via an insulating film (not shown).

To reduce the space between adjacent signal lines 3, the source electrode 4a and the drain electrode 4b of each thin film transistor 4 are installed in the direction of signal lines 3, and the gate electrode 4c of each thin film transistor 4 integrates a part of the scanning line 2. The part of the signal line 3 that crosses the scanning line 2 forms an L-shaped connecting portion 3a in a plan view, with the signal line 3 having thick line width extending over to the gate electrode 4c. The edge of the connecting portion 3a that protrudes from the signal line 3 in the longitudinal direction of the scanning line 2, namely drain electrode 4b, is integrated with the signal line 3. Since the L-shaped connecting portion 3a forms a concave area 4g surrounded on three sides when the signal line 3 including the connecting portion 3a and the drain electrode 4b are etched, etchant and washing liquid used after etching retain in the concave area 4g as in the case disclosed in JP2002-98993A, thus causing improper processing or insufficient drying.

In the liquid crystal display device 1, since the gate electrode 4c is formed integrating a part of the scanning line 2, and thus the pitch between signal lines is small, it is infeasible to apply the structure disclosed in JP2002-98993A to eliminate the emergence of a concave area 4g. Although the line width is made as small as 3 μm for example to minimize the pitch of signal lines 3, the area in proximity to the intersection of the signal line 3 and the scanning line 2 is bulging because the scanning line 2 is installed orthogonal to the signal line 3. Since the signal line 3 is formed over the scanning line 2, the connecting portion 3a along the longitudinal direction of the signal line 3 must remain wide to prevent a so-called disconnection caused by steps. Therefore, the space reduction of signal lines 3 is restricted.

The above-mentioned problem also arises with a liquid crystal display device in which a drain electrode and a source electrode of each thin film transistor are installed reversely, namely the source electrode is connected to a signal line and the drain electrode is connected to a pixel electrode.

SUMMARY OF THE INVENTION

The purpose of the present invention is to solve the above problem by providing an interconnection structure between a signal line and a thin film transistor capable of achieving high aperture rate and high definition.

The present invention provides a TFT array substrate comprising a plurality of scanning lines, an insulating film covering the plurality of scanning lines, a plurality of signal lines placed on the insulating film, each of which has an intersection with the scanning line via the insulating film, a plurality of pixel electrodes, each of which installed adjacent to the scanning line and the signal line, a plurality of thin film transistors, each of which having a gate electrode, drain electrode, and source electrode, connected to a semiconductor layer, gate insulating film, and the scanning lines respectively, a plurality of relay electrodes, each of which provided with a first overlapped portion located on the intersection with the signal line and having the same or longer length than that of the intersection, a second overlapped portion formed on the drain electrode, and a connecting area that connects the first and the second overlapped areas, to electrically connect the signal lines either to the drain electrode or to the source electrode, and pixel electrodes connected to the other of the drain and the source electrodes of the thin film transistors.

The present invention also provides a TFT array substrate comprising scanning lines, a bottom insulating film covering the scanning lines, signal lines placed on the bottom insulating film and having an intersection with the scanning line via the bottom insulating layer, pixel electrodes disposed adjacent to the scanning line and the signal line, thin film transistors having a gate electrode, drain electrode, and source electrode, connected to a semiconductor layer, gate insulating film, and the scanning lines, relay electrodes provided with a first overlapped portion located at the intersection with the signal line and having the same or longer length than that of the point of intersection, to electrically connect the signal lines either to the drain electrode or to the source electrode, a pedestal having an overlapped portion formed on the source electrode and a main portion extending in parallel with the extending direction of the signal lines from the overlapped portion, a top insulating film covering the thin film transistor and having an opening to expose a part of the main portion of the pedestal, and pixel electrodes formed on the top insulating film and connected to the main portion of the pedestal via the opening.

The drain electrode of a TFT array substrate according to the present invention is not connected directly to signal lines but connected via a relay electrode formed on a layer different from the one on which signal lines and a drain electrode are formed. Consequently, since no concave area exists, when the signal line and the drain electrode are formed, improper processing due to retention of etchant is prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 1B is a cross-sectional view taken along the line IB-IB, whereas

FIG. 2A is a schematic plan view illustrating the first step of the manufacturing process of the TFT array substrate shown in FIGS. 1A to 1C.

FIG. 2B is a cross-sectional view taken along the line IIB-IIB of FIG. 2A.

FIG. 3A is a schematic plan view illustrating the second step of the manufacturing process of the TFT array substrate.

FIG. 3B is a cross-sectional view taken along the line IIIB-IIIB of FIG. 3A.

DETAIL DESCRIPTION OF THE PREFERRED EMBODIMENTS

Embodiments of the present invention will be described in detail hereinafter with reference to the appended drawings. The same or corresponding members in each drawing are represented by the same symbols.

Figure 1A:
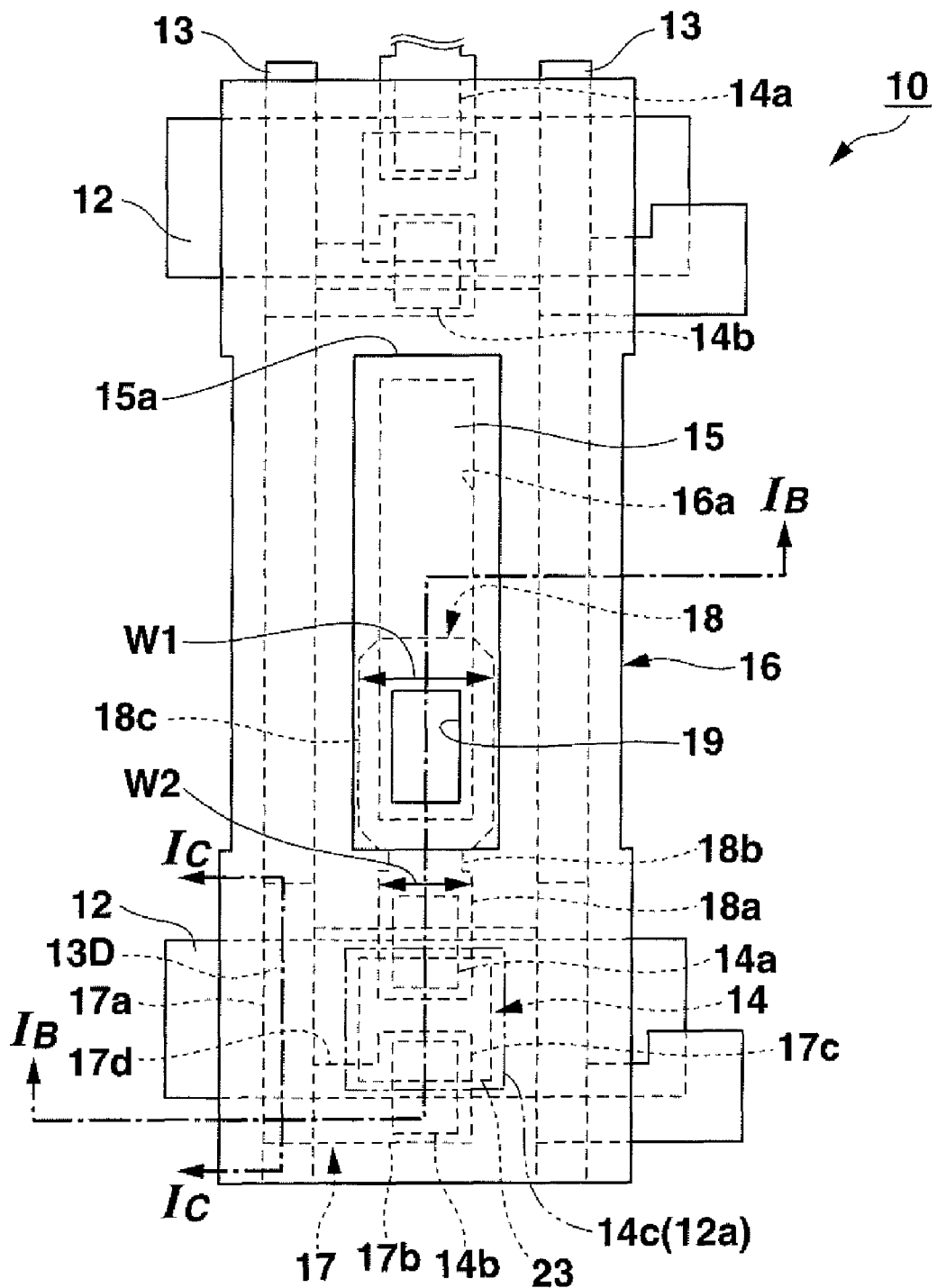
FIG. 1A is a schematic plan view illustrating a structural example of a TFT array substrate for one pixel applicable to liquid crystal display devices.
Figure 1B:
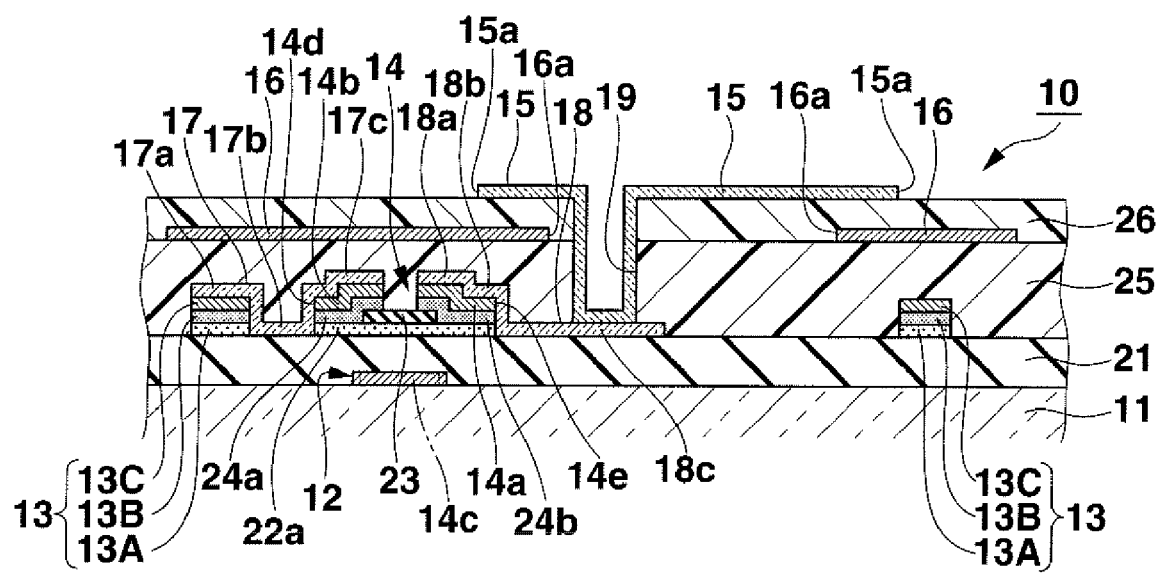
Figure 1C:
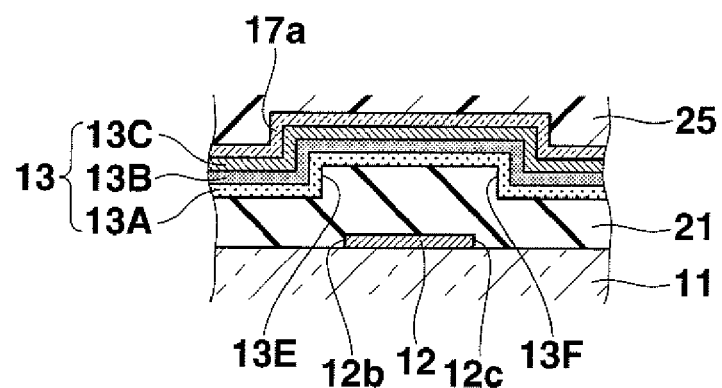
FIG. 1C is a cross-sectional view taken along the line IC-IC, of FIG. 1.

FIG. 1A is a schematic plan view illustrating a TFT array substrate in the first embodiment of the present invention applicable to liquid crystal displays, etc. FIG. 1B is a cross-sectional view taken along the line IB-IB, whereas FIG. 1C is a cross-sectional view taken along the line IC-IC, of FIG. 1A.

As shown in FIGS. 1A and 1B, a TFT array substrate 10 according to the first embodiment of the present invention comprises a transparent substrate 11 made of a transparent material such as glass, a plurality of scanning lines 12 formed on the transparent substrate 11 and extending in the row direction in FIG. 1A in parallel with each other, an insulating film 21 formed to cover the scanning lines, a plurality of signal lines 13 formed over the transparent substrate 11 and extending in the column direction in parallel with each other, a plurality of thin film transistors 14 formed in proximity to a point of intersection of a scanning line 12 and a signal line 13 for each region defined by the scanning line 12 and the signal line 13, a plurality of pixel electrodes 15 formed adjacent to the scanning line 12 and the signal line 13, namely formed in each of the regions defined by the scanning line 12 and the signal lines 13, and connected to the thin film transistor 14, and a storage capacitor electrode 16 formed between the scanning line 12/signal line 13 and the pixel electrode 15.

To create a liquid crystal display device using the TFT array substrate 10, space for placing a counter substrate having a counter electrode is provided over the TFT array substrate 10, and liquid crystal is injected between each pixel electrode and counter electrode (not shown). In the TFT array substrate 10 shown in FIG. 1A, a pair of scanning lines 12 and a pair of signal lines 13 form a thin long region along the longitudinal direction of the signal line 13. Each of the regions corresponds to a pixel, and such regions are placed in the TFT array substrate 10 in a matrix.

The structure of the TFT array substrate 10 will be described hereinafter in detail.

Scanning lines 12 are constituted by a first electroconductive film made of Al, Cr, etc. on the transparent substrate 11. Each signal line 13 comprises an amorphous silicon film 13A formed on the first insulating film 21 made of SiN, etc., an ohmic contact layer 13B made of n+ amorphous silicon, etc. formed on the amorphous silicon film 13A, and a second electroconductive film 13C made of Al, Cr, etc. formed on the ohmic contact layer 13B. Each signal line 13 has an intersection 13D with a scanning line 12, and the width of the intersection 13D is practically the same as that of other regions of the signal line 13. The width of the signal line 13 at its intersection 13D will be detailed in the description on the manufacturing method.

Each thin film transistor 14 comprises a semiconductor layer 22a made of an amorphous silicon film, a gate insulating film 21, a gate electrode 14c connected to the scanning line 12, a drain electrode 14b connected to the signal line 13, a source electrode 14a connected to a pixel electrode 15, an ohmic contact layer 24a on the drain side made of n+ amorphous silicon, etc., and an ohmic contact layer 24b on the source side made of n+ amorphous silicon, etc. In FIG. 1A, the region 12a shown by the alternate long and two short dashes line is equivalent to the region of the gate electrode 14c. The drain electrode 14b and the source electrode 14a are formed linearly in the direction of the signal line 13. The drain electrode 14b is connected to the signal line 13 via a relay electrode 17. The relay electrode 17 is formed overlapped with the drain electrode 14b and the signal line 13, and in the region between the drain electrode 14b and the signal line 13, the relay electrode 17 is formed on a gate insulating film 21 as the first insulating film. The gate electrode 14c in each of the thin film transistor 14 is formed integrating a part of the scanning line 12. The gate insulating film 21 of each of the thin film transistor 14 is formed integrating a part of the first insulating film.

Each pixel electrode 15 made of ITO is connected to a pedestal 18, which is connected to the source electrode 14a of the thin film transistor 14, via a contact hole 19. As shown in FIG. 1A, the pixel electrode 15 is formed across the entire region defined by the scanning lines 12 placed on the periphery of a pixel, namely at the top and the bottom of the plan view, and the signal lines 13 on both sides.

Each storage capacitor electrode 16 made of Al, Cr, etc. is formed along the periphery of a pixel. Specifically, the storage capacitor electrode 16 is formed in a frame-like shape, covering the scanning lines 12 formed at the top and the bottom, and the signal lines 13 formed on both sides, as shown in FIG. 1A. The storage capacitor electrode 16 is also covering the thin film transistor 14. The inner periphery 16a of the storage capacitor electrode is formed inside the external periphery 16a of the pixel electrode 15 to allow a part of the storage capacitor electrode 16 to overlap with the periphery of the pixel electrode 15.

Each relay electrode 17 is made up integrally of a first overlapped portion 17a, an elongated portion 17b, and a second overlapped portion 17c, forming an area 17d enclosed by the first overlapped portion 17a, the elongated portion 17b, and the second overlapped portion 17c on three sides. More specifically, the first overlapped portion 17a overlaps with the region where the signal line 13 crosses over the scanning line 12, namely the intersection 13D. The elongated portion 17b extends from one end of the first overlapped portion 17a along the longitudinal side of the scanning line 12. The second overlapped portion 17c extends from the tip of the elongated portion 17b in parallel with the first overlapped portion 17a, overlapped with the drain electrode 14b of the thin film transistor 14.

The first overlapped portion 17a extends along the longitudinal side of the signal line 13 at the intersection 13D. Specifically, as shown in FIG. 1C, the first overlapped portion 17a has a length sufficient to cover each stepped portion 13E, 13F of the first insulating film 21 corresponding to each edge 12b, 12c of the scanning line 12 in a width direction. The first overlapped portion 17a covers the entire region where the signal line 13 crosses over the scanning line 12 across the intersection 13D. The first overlapped portion 17a preferably overlaps with the signal line 13 in the area extending in the column direction rather than in the intersection 13D only, namely in the region along the longitudinal direction of the signal line 13. The first overlapped portion 17a is formed longer than the width of the scanning line 12. The width of the first overlapped portion 17a will be detailed in the description on the manufacturing method.

The second overlapped portion 17c is formed covering the both ends of the drain electrode 14b in the width direction, namely the longitudinal direction of the scanning line 12 in FIG. 1A. FIG. 1B illustrates the state in which one end face 14d of the drain electrode 14b in the width direction is covered by the second overlapped portion 17c.

The first overlapped portion 17a, the elongated portion 17b, and the second overlapped portion 17c are formed by an integrated electroconductive layer, preferably a transparent electrode film. The single electroconductive layer as an electroconductive layer other than the signal line 13 is preferably formed on the signal line 13 and the drain electrode 14b of the thin film transistor 14. The second overlapped potion 17c covers the entire drain electrode 14b in the figure, but the second overlapped portion 17c may cover the drain electrode 14b only partially.

The pedestal 18 is comprised of an electroconductive layer different from the signal line 13. Specifically, the pedestal 18 is made up integrally of a third overlapped portion 18a, a connection 18b, and a main portion 18c. Preferably, the pedestal 18 is a transparent electrode film made of the same conductive material as the relay electrode 17. The third overlapped portion 18a is overlapped with the source electrode 14a. The connection 18b extends from the third overlapped portion 18a in the direction opposite to the second overlapped portion 17c, and has a width smaller than that of the third overlapped portion 18a and the main portion 18c. The main portion 18c is coupled with the connection 18b, extends from the connection 18b along the signal line 13, and is placed on the gate insulating film 21 in the region enclosed with the signal lines 13 on right and left sides and the scanning lines 12 at the top and the bottom.

The third overlapped portion 18a is formed covering the both ends of the source electrode 14a in the width direction, namely the longitudinal direction of the scanning line 12 in FIG. 1A. FIG. 1B illustrates the state in which one of the end faces 14e viewed from the depth direction of the source electrode 14a, namely from the direction orthogonal to the width direction, is covered by the third overlapped portion 18a. The third overlapped portion 18a is formed on the source electrode 14a. As shown in FIG. 1, the width W1 of the main portion 18c is designed wider than the width W2 of the third overlapped portion 18a. The figure illustrates the state in which the third overlapped portion 18a covers the entire source electrode 14a, but the third overlapped portion 18a may be formed to cover the source electrode 14a partially.

The contact hole 19, which is used to connect the pedestal 18 and the pixel electrodes, is formed penetrating the second insulating film 25 and the third insulating film 26 made of SiN, etc. above the center of the pedestal 18. When the pixel electrode 15 is formed, a part of the pixel electrode 15 covers the inner wall of the contact hole 19 and a part of the surface of the pedestal 18, which is exposed by the existence of the contact hole 19, thus electrically connecting the pixel electrode 15 to the pedestal 18.

Hereinafter, the manufacturing method of the TFT array substrate 10 will be described by referring to FIGS. 2 to 6 illustrating each process. In the first step, as shown in FIGS. 2A and 2B, a first electroconductive film is formed on a transparent substrate 11, the first electroconductive film is processed using a mask for patterning, and each of the patterned region forms a plurality of scanning lines 12 including a gate electrode 14c. In FIG. 2A, the region 12a enclosed by the alternate long and two short dashes line is a gate electrode 14c. A part of the scanning line 12 constitutes the gate electrode 14c. As the next step, a gate insulating film 21 made of SiN, etc is formed on the scanning line 12 including the gate electrode 14c, and on the transparent substrate 11. On the gate insulating film 21, a semiconductor layer 22 made of amorphous silicon film, etc. and an insulating film 21 for forming a channel protective film made of SiN, etc. are formed sequentially, a mask for patterning is placed on the insulating film, and the insulating film is etched to form an etching stopper layer 23.

In the second step, as shown in FIGS. 3A and 3B, an n+ amorphous silicon layer for ohmic contact and a second electroconductive film are formed sequentially on the etching stopper layer 23 and a semiconductor layer 22, a mask for patterning is placed on the second electroconductive film, and the second electroconductive film is etched to form the second electroconductive film portion 13C of the signal line 13, source electrode 14a, and drain electrode 14b. Using the second electroconductive film portion 13C of the signal line 13, source electrode 14a, and drain electrode 14b as a mask, the n+ amorphous silicon layer and the semiconductor layer 22 are etched to form an ohmic contact layer 13B, an ohmic contact layer on the drain side 24a, an ohmic contact layer on the source side 24b, and an amorphous silicon film semiconductor layer 22a as an active layer. In the second step, by laminating the amorphous silicon film 13A, ohmic contact layer 13B, and the second electroconductive film 13C, the signal line 13 is formed into a laminated structure having the same line width with that of the scanning line 12 over the entire length including the intersection 13D.

The drain electrode 14b of the thin film transistor 14 is separated from the signal line 13, and formed in the minimal dimensions required to function as a drain electrode 14b. Similarly, the source electrode 14a of the thin film transistor 14 is formed in the minimal dimensions required to function as a source electrode 14a. In the second step, as shown in FIGS. 3A and 3B, the drain electrode 14b and the signal line 13 are not connected via a relay electrode 17. Specifically, the patterning of the drain electrode 14b and the second electroconductive film 13C of the signal line 13 performed by etching forms a groove extending in the direction parallel to the signal line 13 between the drain electrode 14b and the second electroconductive film 13C, but the patterning does not form a concave region 14g having an electroconductive layer extending in the direction orthogonal to the signal line 13. Similarly, the processing of separating the amorphous silicon layer 13A and the ohmic contact layer on the drain side 24a and the processing of separating the amorphous silicon layer 13A from the semiconductor layer 22a form a groove extending in the direction parallel to the signal line 13, but do not form a concave region 14g having an electroconductive layer extending in the direction orthogonal to the signal line 13. In other words, since an electroconductive layer extending in the direction orthogonal to the signal line 13 does not exist, nothing hampers etchant and washing liquid used after etching from flowing in the direction parallel to the signal line 13. Consequently, retention of etchant and washing liquid used after etching or improper processing due to insufficient drying does not occur.

Figure 4A:
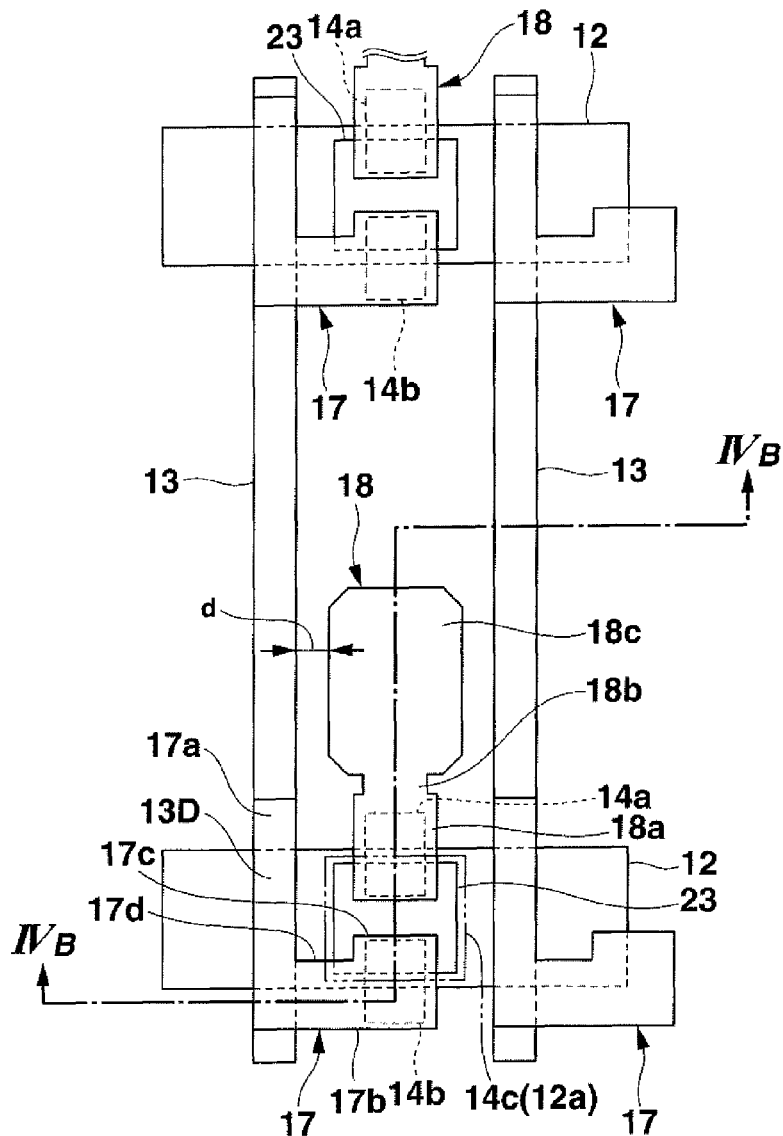
FIG. 4A is a schematic plan view illustrating the third step of the manufacturing process of the TFT array substrate.
Figure 4B:
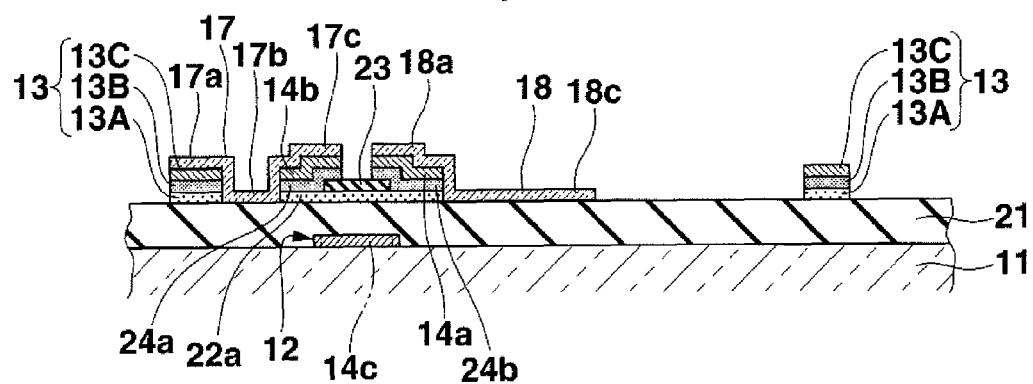
FIG. 4B is a cross-sectional view taken along the line IVB-IVB of FIG. 4A.

In the third step, as shown in FIGS. 4A and 4B, a third electroconductive film is formed to cover the signal lines 13, source electrode 14a, and drain electrode 14b over the entire surface of the first insulating film 21. A mask for patterning is placed on the third electroconductive film, which is then etched. A relay electrode 17 and a pedestal 18 are thus formed, and the relay electrode 17 connects the drain electrode 14b to the signal line 13, and the source electrode 14a is connected to the pedestal 18. The relay electrode 17 and the pedestal 18 are capable of establishing good ohmic contact with the drain electrode 14b and the source electrode 14a. Since the first overlapped portion 17a of the relay electrode 17 is formed on the intersection 13D of the signal line 13, the first overlapped portion 17a serves as the backing of the signal line 13. By providing the relay electrode 17, the adverse effect of so-called disconnection caused by steps can be eliminated without widening the width of the signal line 13 at the intersection 13D with the scanning line 12.

Hereinafter, the width of the first overlapped region 17a of the relay electrode 17 at the intersection 13D, namely the length along the longitudinal direction of the scanning line 12 extending in the row direction, will be described in detail. Basically, the width of the signal line 13 at the intersection 13D and that of the first overlapped portion 17a of the relay electrode 17 may be the same. However, when wiring is installed on a layer having steps, the width of the wiring on the upper face becomes smaller than that of the wiring on the bottom face, due to the difference in height affecting the exposure of photoresist. For example, if the thickness of the gate electrode 14c is 180 nm, the width of the wiring on the upper face of a step becomes smaller than that of the lower side by approximately 1 μm. Consequently, if the width of the signal line 13 is 3 μm, the width of the signal line on the upper face of the step must be designed to be approximately 4 μm. The width at the intersection 13D of the signal line 13 is thus designed with the dimensional reduction at steps that occurs at the time of pattern formation taken into consideration. This also applies to the design of the first overlapped region 17a of the relay electrode 17. However, since the first overlapped region 17a of the relay electrode 17 need not have a function of transmitting signals to the previous or later stage, no problem will occur if its width is made to be the same as that of the portion other than the intersection 13D of the signal line 13, 3 μm in the above case.

The process of forming a relay electrode 17 and a pedestal 18, and etching a third electroconductive film should not have an impact on the signal line 13, source electrode 14a, and drain electrode 14b. There are various combinations of materials for the second and the third electroconductive films that satisfy the above condition. Preferably, a transparent electroconductive film made of ITO, etc. is used as the third electroconductive film, because an ITO transparent electroconductive film demonstrates good step covering performance with relatively thin film thickness. In particular, since the first overlapped region 17a of the relay electrode 17 is ideal as the backing of the signal line 13, and the three-dimensional shape of the thin film transistor 14 does not change significantly, the possibility that the liquid crystal alignment of the liquid crystal cell placed over the transistor is disturbed is considered to be small.

Since the pedestal 18 is formed in a process different from the one in which signal lines 13 are formed, the gap d between one side of the pedestal 18 and the signal line 13 (See FIG. 4A) can be made smaller compared with the case in which the pedestal and the signal line 13 are formed in the same process. The reason for this is detailed as follows: The resolution of currently available exposure equipment is approximately 2.5 to 3.0 μm. Consequently, in the case in which the pedestal 18 and the signal line 13 are formed in the same process, the gap d between one side of the pedestal 18 and the signal line 13 should fall within the 2.5 to 3.0 μm range in the exposure process for forming photoresist mask, thus requiring space of 5.0 to 6.0 μm for both sides of the pedestal 18. Meanwhile, in the embodiment of the present invention, the pedestal is formed in a different process following the one in which the signal line 13 is formed. Consequently, in the pedestal forming process, it is only necessary to maintain the minimum gap with the adjacent base 18 at 2.5 to 3.0 μm. Since a signal line 13 exists between pedestals adjacent to each other, the gap larger than the resolution of the exposure equipment is ensured.

From the above, the gap d between the pedestal 18 and the signal line 13 is determined only by the positioning accuracy of a positioning device. Since the positioning tolerance of a positioning device is 1 μm or less, the gap can be made to be 2 μm at the maximum for both sides of the pedestal. In other words, in the embodiment of the present invention, the space between the pedestal 18 and the signal line 13, namely the pitch of the signal lines 13, can be reduced, which allows more signal lines to be placed on a display panel having a given area and thus high resolution images can be obtained.

Figure 5A:
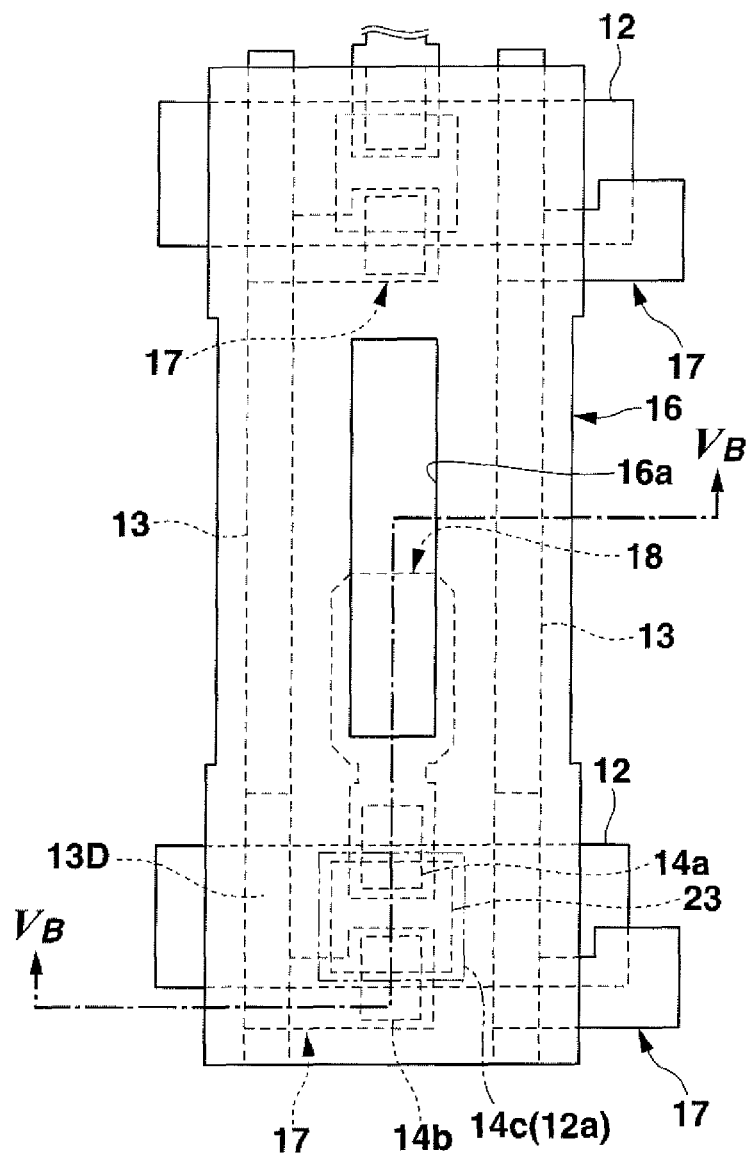
FIG. 5A is a schematic plan view illustrating the fourth step of the manufacturing process of the TFT array substrate.
Figure 5B:
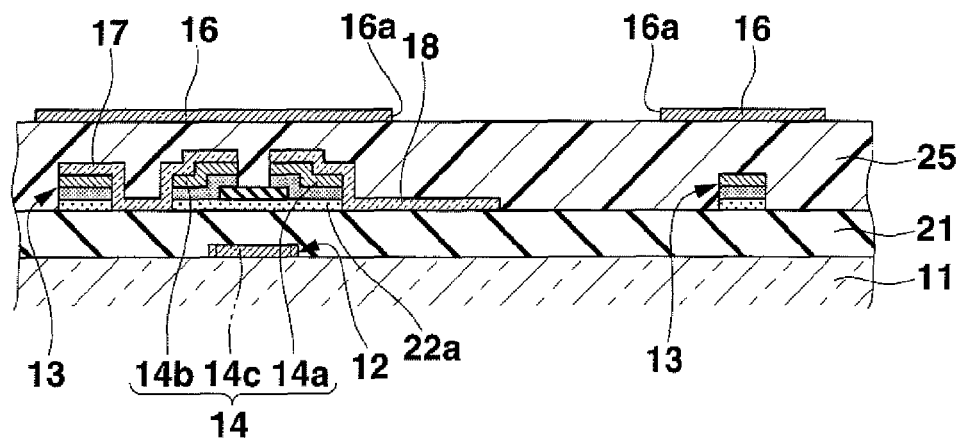
FIG. 5B is a cross-sectional view taken along the line VB-VB of FIG. 5A.

In the fourth step, as shown in FIGS. 5A and 5B, the second insulating film 25 and the fourth electroconductive film are formed over the entire surface including the relay electrode 17 and the pedestal 18. On the fourth electroconductive film, a patterning mask is placed, and the fourth electroconductive film is etched to form a storage capacitor electrode 16. The storage capacitor electrode 16 is formed to cover the scanning lines 12 and the signal lines 13, and not to cover the region of the contact hole 19 to be formed in the fifth step. The storage capacitor electrode 16 covers the region above the thin film transistor 14 in the example shown in FIG. 5A. However, the region above the thin film transistor 14 can be hollowed out.

Figure 6A:
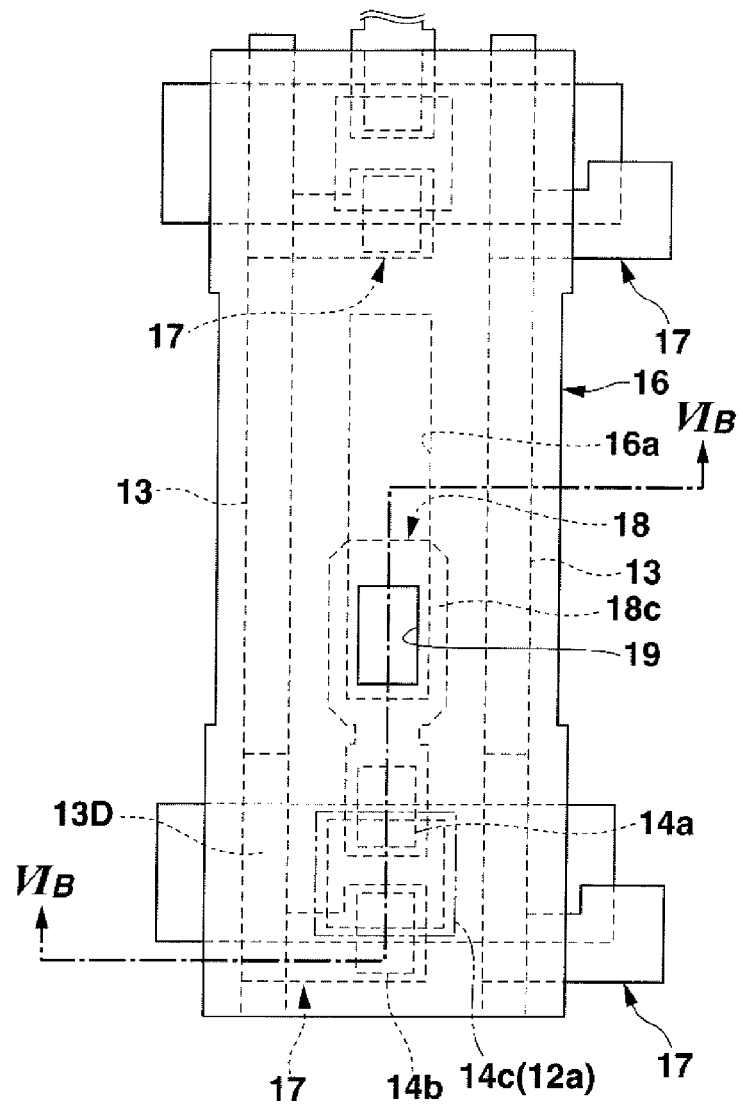
FIG. 6A is a schematic plan view illustrating the fifth step of the manufacturing process of the TFT array substrate.
Figure 6B:
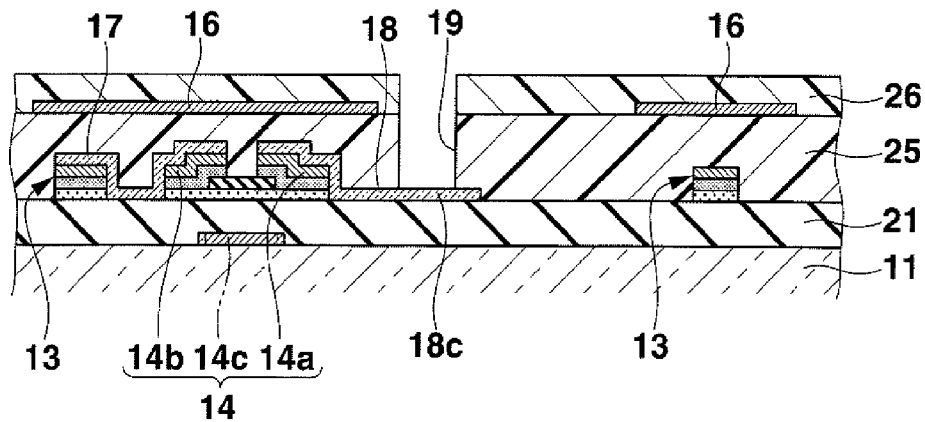
FIG. 6B is a cross-sectional view taken along the line VIB-VIB of FIG. 6A.
Figure 7:
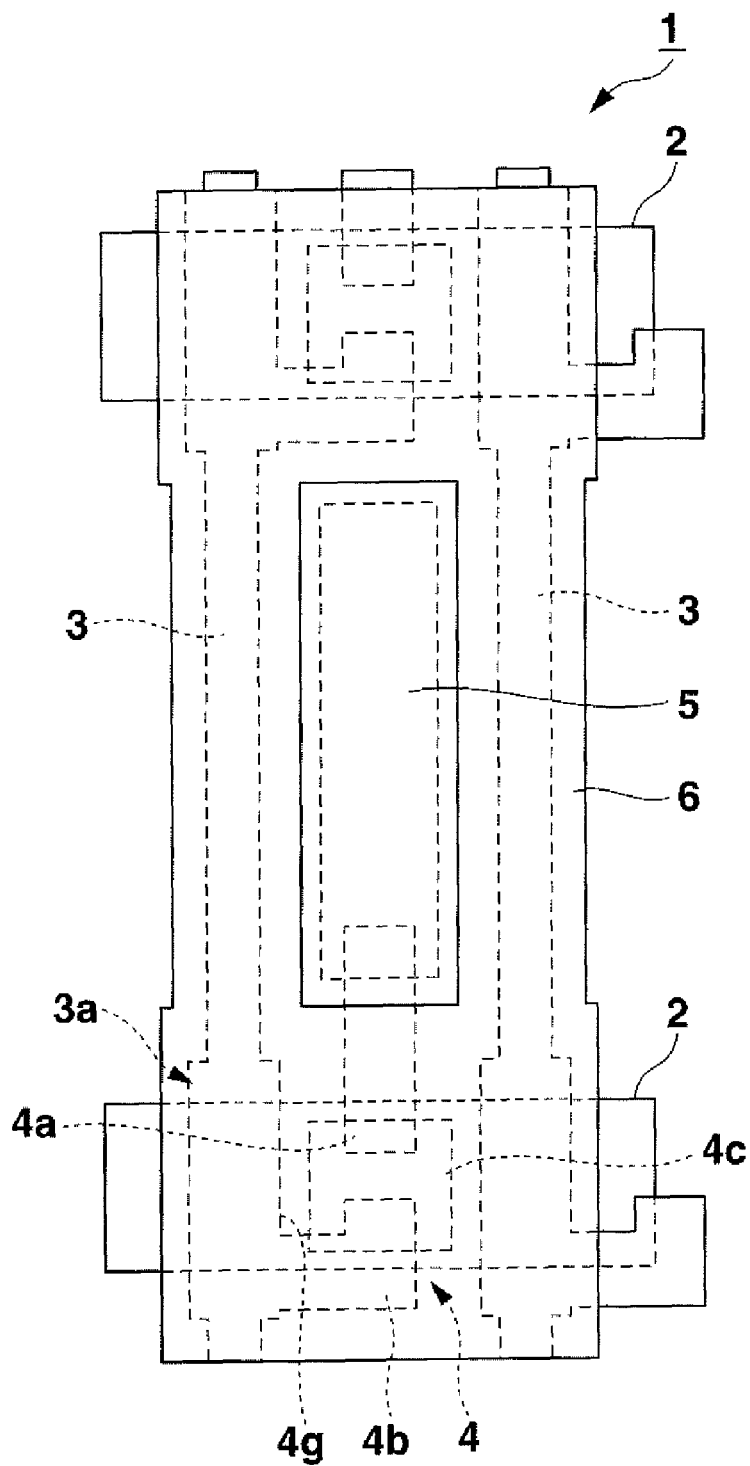
FIG. 7 schematically illustrates the structure of a pixel of a conventional liquid crystal display device.

In the fifth step, as shown in FIG. 6, a third insulating film 26 is formed over the entire surface including the storage capacitor electrode 16 and the second insulating film 25, a patterning mask is placed on the third insulating film 26, and the third insulating film 26 and the second insulating film 25 are etched to form a contact hole 19, which penetrates the third insulating film 26 and the second insulating film 25, exposing a part of the main portion 18c of the pedestal 18.

In the sixth step, the last step, a pixel electrode film made of ITO, etc is deposited on the third insulating film 26 over the entire surface, and a patterning mask is placed on the pixel electrode film, which is then etched to form a pixel electrode 15 as shown in FIGS. 1A, 1B, and 1C. The pixel electrode film is deposited on the surface of the inner wall of the contact hole 19 and the surface of the main portion 18c of the pedestal 18 exposed at the bottom of the contact hole 19. Specifically, since the pixel electrode 15 is connected to the pedestal 18 via the contact hole 19, the pixel electrode 15 is electrically connected to the source electrode 14a of the thin film transistor 14.

By undergoing the processes described above, a TFT array substrate 10 shown in FIG. 1A is created.

Various modifications can be made in the interconnection structure of the present invention in addition to the embodiments described above. It goes without saying that those modifications are included in the scope of the present invention. For example, in the embodiment described above, the source electrode 14a of the thin film transistor 14 is connected to the pixel electrode 15 from the pedestal 18 via the contact hole 19, and the drain electrode 14b is connected to the signal line 13. Reversely, the source electrode 14a may be connected to the signal line 13, and the drain electrode 14b may be connected to the pixel electrode 15.

The TFT array substrate of the present invention may be configured by forming an insulating film between a pixel electrode and scanning/signal lines, and without installing a storage capacitor electrode 16. The TFT array substrate of the present invention is applicable not only to liquid crystal displays but also to other devices such as organic EL displays.

What is claimed is:

1. A TFT array substrate comprising:
a plurality of scanning lines,
an insulating film covering the plurality of scanning lines,
a plurality of signal lines placed on the insulating film, each of which has an intersection with a scanning line via the insulating film,
a plurality of pixel electrodes, each of which is disposed adjacent to a scanning line and a signal line,
a plurality of thin film transistors, each of which has a semiconductor layer, a gate insulating film, a gate electrode connected to the scanning line, a drain electrode, and a source electrode; and
a plurality of relay electrodes, each of which is provided with a first overlapped portion located at the intersection with the signal line and having the same or longer length than that of the intersection, a second overlapped portion formed on the drain electrode, and a connecting portion that connects the first and the second overlapped portions, to electrically connect the signal line to the drain electrode,
wherein the respective relay electrodes are formed of an electroconductive layer that is different from a layer of the drain electrodes and the source electrodes of the respective thin film transistors and the respective signal lines, and
wherein the pixel electrodes are electrically connected to the source electrodes of the respective thin film transistors.

2. The TFT array substrate as set forth in claim 1, wherein a width of the first overlapped portion of the relay electrode is the same as or smaller than that of the signal line at the intersection.

3. The TFT array substrate as set forth in claim 1, wherein the second overlapped portion includes a part that covers both ends of the drain electrode in a width direction.

4. The TFT array substrate as set forth in claim 1, further comprising a pedestal having a third overlapped portion that overlaps the source electrode and a main portion extending along the signal lines,
wherein the pedestal is formed in a layer different from a layer of the drain electrode and the source electrode of the thin film transistor, and
wherein the pixel electrode is electrically connected to the source electrode via the pedestal.

5. The TFT array substrate as set forth in claim 4, wherein the relay electrode and the pedestal are formed using the same material.

6. The TFT array substrate according to claim 4, wherein the relay electrode and the pedestal are made of a transparent electrode film.

7. The TFT array substrate as set forth in claim 4, wherein the third overlapped portion covers both ends of the other electrode in a width direction.

8. The TFT array substrate as set forth in claim 4, wherein the main portion is wider than the third overlapped portion.

9. The TFT array substrate according to claim 1, further comprising:
   another insulating film placed between the pixel electrode and the signal line, and
   a frame-shaped storage capacitor electrode whose internal periphery is inside the outer periphery of the pixel electrode.

10. The TFT array substrate as set forth in claim 9, further comprising a pedestal having a third overlapped portion overlapping the source electrode and a main portion that extends along the signal lines,
   wherein the pedestal is formed in a layer different from a layer of the drain electrode and the source electrode of the thin film transistor, and
   wherein the pixel electrode is electrically connected to the source electrode via the pedestal.

11. The TFT array substrate as set forth in claim 10, wherein the relay electrode and the pedestal are made of a transparent electrode film.

12. The TFT array substrate as set forth in claim 11, wherein the main portion is formed on a gate insulating film.

13. The TFT array substrate as set forth in claim 10, wherein the main portion is wider than the third overlapped portion.

14. A TFT array substrate comprising:
   scanning lines,
   a bottom insulating film covering the scanning lines,
   signal lines placed on the bottom insulating film and having an intersection with a scanning line via the bottom insulating layer,
   pixel electrodes disposed adjacent to the scanning lines and the signal lines,
   a thin film transistor having a semiconductor layer, a gate insulating film, a gate electrode connected to the scanning line, a drain electrode, and a source electrode,
   a relay electrode having a first overlapped portion located at the intersection with the signal line and having the same or longer length than that of the intersection, to electrically connect the signal line to the drain electrode,
   a pedestal having an overlapped portion formed on the source electrode and a main portion extending in parallel with the extending direction of the signal lines, and
   a top insulating film covering the thin film transistor and having an opening for exposing a part of the main portion of the pedestal,
   wherein the relay electrode is formed of an electroconductive layer that is different from a layer of the drain electrode and the source electrode of the thin film transistor, and
   wherein the pixel electrode is formed on the top insulating film and is connected to the main portion of the pedestal via the opening.

15. The TFT array substrate as set forth in claim 14, wherein a side of the pixel electrode parallel to the extending direction of the signal lines is longer than a side parallel to the extending direction of the scanning lines.

16. The TFT array substrate as set forth in claim 14, wherein a gap between the main portion of the pedestal and the signal line is 1 µm or less.

17. The TFT array substrate as set forth in claim 14, wherein the drain electrode, source electrode, and the pedestal are arranged approximately linearly in parallel with the extending direction of the signal lines.

18. The TFT array substrate as set forth in claim 14, wherein the signal lines have a laminated structure of multiple electroconductive layers,
   wherein the pedestal is a single electroconductive layer, and
   wherein the pedestal is formed in a layer different from a layer of the drain electrode and the source electrode of the thin film transistor.

19. A TFT array substrate comprising:
   a plurality of scanning lines;
   an insulating film covering the plurality of scanning lines;
   a plurality of signal lines placed on the insulating film, each of which has an intersection with a scanning line via the insulating film;
   a plurality of pixel electrodes, each of which is disposed adjacent to a scanning line and a signal line;
   a plurality of thin film transistors, each of which has a semiconductor layer, a gate insulating film, a gate electrode connected to the scanning line, a drain electrode, and a source electrode; and
   a plurality of relay electrodes, each of which is provided with a first overlapped portion located at the intersection with the signal line and having the same or longer length than that of the intersection, a second overlapped portion formed on the drain electrode, and a connecting portion that connects the first and the second overlapped portions, to electrically connect the signal line to the drain electrode;
   another insulating film placed between the pixel electrode and the signal line; and
   a frame-shaped storage capacitor electrode whose internal periphery is inside the outer periphery of the pixel electrode,
   wherein the pixel electrodes are electrically connected to the source electrodes of the respective thin film transistors.

20. A TFT array substrate comprising:
   scanning lines;
   a bottom insulating film covering the scanning lines;
   signal lines placed on the bottom insulating film and having an intersection with a scanning line via the bottom insulating layer;
   pixel electrodes disposed adjacent to the scanning lines and the signal lines;
   a thin film transistor having a semiconductor layer, a gate insulating film, a gate electrode connected to the scanning line, a drain electrode, and a source electrode;
   a relay electrode having a first overlapped portion located at the intersection with the signal line and having the same or longer length than that of the intersection, to electrically connect the signal line to the drain electrode;
   a pedestal having an overlapped portion formed on the source electrode and a main portion extending in parallel with the extending direction of the signal lines; and
   a top insulating film covering the thin film transistor and having an opening for exposing a part of the main portion of the pedestal,
   wherein the pixel electrode is formed on the top insulating film and is connected to the main portion of the pedestal via the opening, and
   wherein a gap between the main portion of the pedestal and the signal line is 1 µm or less.

* * * * *